(12) United States Patent
Nagayama et al.

(10) Patent No.: US 9,310,596 B2
(45) Date of Patent: Apr. 12, 2016

(54) COMPOUND MICROSCOPE DEVICE

(75) Inventors: Kuniaki Nagayama, Aichi (JP); Yoshihiro Arai, Tokyo (JP); Hirofumi Iijima, Tokyo (JP); Susumu Terakawa, Shizuoka (JP)

(73) Assignees: INTER-UNIVERSITY RESEARCH INSTITUTE CORPORATION NATIONAL INSTITUTE OF NATURAL SCIENCES, Tokyo (JP); Kuniaki Nagayama, Aichi (JP); JEOL LTD., Tokyo (JP)

( * ) Notice: Subject to any disclaimer, the term of this patent is extended or adjusted under 35 U.S.C. 154(b) by 655 days.

(21) Appl. No.: 13/638,981

(22) PCT Filed: Apr. 6, 2011

(86) PCT No.: PCT/JP2011/058684
§ 371 (c)(1),
(2), (4) Date: Dec. 7, 2012

(87) PCT Pub. No.: WO2011/126041
PCT Pub. Date: Oct. 13, 2011

(65) Prior Publication Data
US 2013/0088775 A1    Apr. 11, 2013

(30) Foreign Application Priority Data

Apr. 6, 2010 (JP) ................. 2010-088201

(51) Int. Cl.
*G02B 21/00* (2006.01)
*H01J 37/28* (2006.01)
(Continued)

(52) U.S. Cl.
CPC ........ *G02B 21/0076* (2013.01); *G02B 21/0032* (2013.01); *G02B 21/365* (2013.01);
(Continued)

(58) Field of Classification Search
CPC ............... G02B 21/00; G02B 21/0004; G02B 21/0016; G02B 21/002; G02B 21/0028; G02B 21/0032; G02B 21/06; G02B 21/18; H01J 37/141; H01J 37/1413; H01J 37/244; H01J 37/26; H01J 37/261; H01J 37/28; H01J 37/285; H01J 37/30
See application file for complete search history.

(56) References Cited

U.S. PATENT DOCUMENTS 2,944,172 A * 7/1960 Opitz et al. ................. 313/7
4,349,242 A * 9/1982 Ogura ..................... 250/311
(Continued)

FOREIGN PATENT DOCUMENTS

EP    0 995 086    11/2007
EP    1 953 791    8/2008
(Continued)

OTHER PUBLICATIONS

Alexandra V. Agronskaia et al., "Integrated Fluorescence and transmission electron microscopy", Journal of Structural Biology, vol. 164, pp. 183-189, 1008.

(Continued)

*Primary Examiner* — Thong Nguyen
(74) *Attorney, Agent, or Firm* — Wenderoth, Lind & Ponack, L.L.P.

(57) ABSTRACT

A compound microscope device allows simultaneous observation of one specimen by a transmission electron microscope and an optical microscope. The compound microscope device 1 of the present invention has a transmission electron microscope 2 and an optical microscope 4. A specimen 10 and a reflection mirror 41 are disposed on an electron optical axis C of an electron ray. The reflection mirror 41 is inclined from the electron optical axis C toward the optical object lens 43 and the specimen 10. Light from the specimen 10 (fluorescent light, reflection light, and the like) is reflected by the reflection mirror 41 and enters into the optical object lens 43. The electron ray from the electron microscope 2 passes through a mounting center hole 42 of the reflection mirror 41. This makes it possible to observe one specimen simultaneously by the electron microscope 2 and the optical microscope 4.

10 Claims, 6 Drawing Sheets

(51) Int. Cl.
*H01J 37/22* (2006.01)
*H01J 37/26* (2006.01)
*G02B 21/36* (2006.01)

(52) U.S. Cl.
CPC .............. *H01J37/228* (2013.01); *H01J 37/26* (2013.01); *H01J 37/28* (2013.01); *H01J 2237/045* (2013.01); *H01J 2237/2608* (2013.01)

(56) References Cited

U.S. PATENT DOCUMENTS

| | | | |
|---|---|---|---|
| 4,537,477 A * | 8/1985 | Takagi et al. | 250/311 |
| 5,168,166 A * | 12/1992 | Hayakawa et al. | 250/492.2 |
| 6,531,697 B1 * | 3/2003 | Nakamura et al. | 250/311 |
| 6,859,313 B2 | 2/2005 | Iketaki et al. | |
| 2002/0167724 A1 | 11/2002 | Iketaki et al. | |
| 2003/0053048 A1 | 3/2003 | Bennett et al. | |
| 2008/0210869 A1 | 9/2008 | Gerritsen et al. | |
| 2011/0226949 A1 * | 9/2011 | Zeidler et al. | 250/310 |

FOREIGN PATENT DOCUMENTS

| | | |
|---|---|---|
| JP | 55-32304 | 3/1980 |
| JP | 55-90046 | 7/1980 |
| JP | 63-298947 | 12/1988 |
| JP | 5-113418 | 5/1993 |
| JP | 2002-514747 | 5/2002 |
| JP | 2003-66338 | 3/2003 |
| JP | 2007-292702 | 11/2007 |
| JP | 2007-322396 | 12/2007 |
| JP | 2008-192616 | 8/2008 |
| JP | 2010-8406 | 1/2010 |
| WO | 99/58939 | 11/1999 |

OTHER PUBLICATIONS

International Preliminary Report issued Aug. 21, 2012 in International (PCT) Application No. PCT/JP2011/058684.

* cited by examiner ated to Japanese Unexamined Patent Application Publication No. S53-161215 (Japanese Unexamined Patent Application Publication No. S55-90046) discloses a device with a combination of a transmission electron microscope and an optical microscope.

COMPOUND MICROSCOPE DEVICE

TECHNICAL FIELD

The present invention relates to physical and chemical devices using electron rays, in particular, transmission electron microscopes and electron beam analyzers.

BACKGROUND ART

Conventionally, there have been already in practical use devices with a combination of a scanning electron microscope and an optical microscope. For example, Japanese Unexamined Patent Application Publication No. S53-161215 (Japanese Unexamined Patent Application Publication No. S55-90046) discloses a device with a combination of a transmission electron microscope and an optical microscope.

FIGS. 8A and 8B illustrate conventional compound microscope devices. In the device of FIG. 8A, a light microscope is disposed adjacent to an electron microscope main body, and a specimen is horizontally moved between electron optical axes of the light microscope and the electron microscope, whereby the specimen can be observed with switching between the light microscope and the electron microscope.

In addition, there is known a device in which two microscopes are integrated as shown in FIG. 8B. In this device, a specimen is rotated at 90° to observe light microscopic images of the specimen (J. Struct. Biol. 164 (2008) 183 to 189).

CITATION LIST

Patent Documents

[Patent Document 1] Japanese Unexamined Patent Application Publication No. S55-90046
[Patent Document 2] Japanese Unexamined Patent Application Publication No. 2010-8406
[Patent Document 3] Japanese Unexamined Patent Application Publication No. H5-113418

Non-Patent Document

[Non-Patent Document 1] Journal of Structural Biology, Volume 164, 2008, pages 183 to 189

Technical Problem

In the techniques disclosed in Patent Document 1 and Non-Patent Document 1, an optical microscope and a transmission electron microscope can be integrated, but an electron beam and an electron optical axis of light are not aligned with each other, and thus a specimen needs to be observed separately by the light microscope and the electron microscope with movements of the specimen such as translation and rotation. Therefore, it is not possible to observe one specimen simultaneously by the light microscope and the electron microscope even though both imaging functions are integrated into a unit device.

For example, a fluorescence microscope performs a swift operation of searching an area where a fluorescently-stained virus in cells, and an electron microscope performs an operation of identifying the searched virus in an enlarged manner. However, it is not possible to search and identify a virus simultaneously on conventional devices. As in the foregoing, conventional devices are not suited for an operation of swiftly detecting a target object and identifying the same, that is, a high-throughput operation.

Patent Documents 2 and 3 both disclose devices for observing one specimen with a combination of an electron microscope and a light microscope. However, these techniques are intended for scanning electron microscopes. Accordingly, there has not yet been provided a technique of allowing simultaneous observation of one specimen with a combination of a transmission electron microscope and a light microscope.

Therefore, a major object of the present invention is to provide a device allowing genuinely simultaneous observation of one specimen, with an integration of a transmission electron microscope and a light microscope.

SUMMARY OF INVENTION

Solution to Problem

A compound microscope device of the present invention has a transmission electron microscope and a light microscope as a single entity. The electron microscope has an electron gun that releases an electron ray toward a specimen; an electromagnetic object lens that images the electron ray; and a detection part into which the electron ray having passed through the electromagnetic object lens is entered, wherein a reflection mirror is disposed in a middle of an electron-optical path of the electron ray, and the light microscope includes light object lens in a position separated from the electron-optical path. The reflection mirror has a reflection surface inclined toward the specimen and the light object lens.

The reflection mirror has a mounting center hole penetrating the reflection mirror in a position crossing the movement path. The mounting center hole desirably has a diameter of 0.1 to 1 mm.

It is desired to provide an angle adjustment mechanism for adjusting an inclination angle of the reflection mirror, and it is more desired to provide a lens adjustment mechanism for adjusting the light object lens.

The electromagnetic object lens may include a cylindrical coil and a yoke covering the coil. The yoke may have a portion with a notch, and the portion of the yoke with the notch may be projected toward inside the coil to form a gap within the electromagnetic object lens. The optical object lens and a specimen holder for placement of the specimen, can be arranged in the gap.

The optical microscope may have a light source, a dichroic mirror, and a light detection part. The dichroic mirror, the light object lens, and the light detection part may be arranged in a straight line crossing the electron-optical path. The dichroic mirror desirably has a reflection surface inclined toward the light object lens and the light source. The light object lens may use a fluorescent microscope lens.

The light microscope may include an illumination reflection mirror disposed on the electron-optical path and a light source separated from the electron optical path. The illumination reflection mirror is desirably positioned on an opposite side of the reflection mirror with the specimen therebetween. The illumination reflection mirror desirably has a reflection surface inclined from the electron-optical path toward the specimen and the light source, and a mounting center hole penetrating the illumination reflection mirror in a position crossing the electron-optical path.

It is desired to dispose a light condenser lens on the electron optical path between the illumination reflection mirror and the specimen. The light condenser lens desirably has a mounting center hole penetrating the light condenser lens in a position crossing the electron-optical path.

It is desired to form a transparent conductive material film on one or more of a surface of the reflection mirror; an inner wall surface of the mounting center hole of the reflection mirror; a surface of the illumination reflection mirror; an inner wall surface of the mounting center hole of the illumination reflection mirror; a surface of a lighting reflection mirror; an inner wall surface of a mounting center hole of the lighting reflection mirror; a surface of the optical condenser lens; an inner wall surface of the mounting center hole of the optical condenser lens; and a surface of the optical object lens.

It is desired to dispose the electromagnetic object lens in a vacuum bath and form an anti-reflection film around the light source in an internal space of a vacuum bath.

Advantageous Effects of Invention

According to the present invention, it is possible to visualize simultaneously an electron microscopic image and a light microscopic image of one specimen.

DESCRIPTION OF EMBODIMENTS

An embodiment for carrying out the present invention will be described below in detail. However, the present invention is not limited to the embodiment described below.

Figure 1:
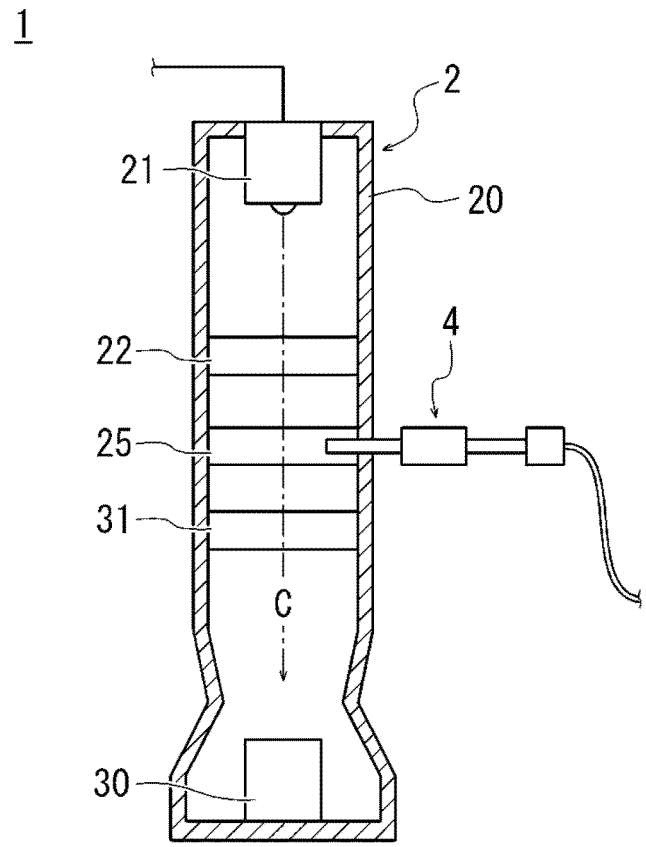
FIG. 1 is a schematic cross section view of a combination of a compound microscope device of the present invention.

In FIG. 1, reference number 1 denotes an example of a compound microscope device of the present invention. The compound microscope device 1 has an electron microscope 2 and an optical microscope 4. Although there is no particular limitation on the structure of the electron microscope 2, the electron microscope 2 has a vacuum bath 20, an electron gun 21, a convergence lens 22, an object lens 25, a projection lens 31, and a detection part 30, for example. The vacuum bath 20 is connected to a vacuum pump (not shown) to form a vacuum atmosphere within the vacuum bath 20.

The electron gun 21 has an injection electrode to emit an electron ray (electron beam) directed toward the internal space of the vacuum bath 20, and the electron ray transfers through the interior of the vacuum bath 20 in which the vacuum atmosphere is formed. Reference sign C of FIG. 1 denotes an electron-optical path of the electron ray (electron optical axis) injected from the electron gun 21. The convergence lens 22, the object lens 25, the projection lens 31, and the detection part 30 are aligned in this order along the electron-optical axis C from the side closer to the electron gun 21. The electron ray is converged by the convergence lens 22, imaged by the object lens 25, magnified by the projection lens 31, and then entered into the detection part 30.

The electron microscope 2 for use in the present invention is a transmission electron microscope (TEM), and a specimen to be observed is placed at the objective lens, which runs across on the electron-optical axis C. Layout of the specimen and the optical microscope 4 will be described below together with a specific example of the object lens 25.

Figure 2:
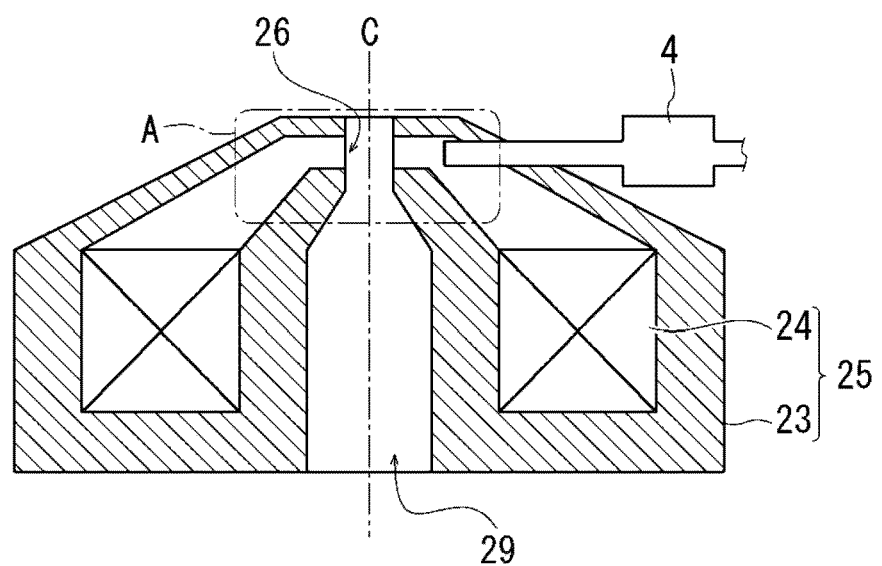
FIG. 2 is a schematic cross section view of one example of a combination of an electromagnetic object lens and a light object lens.

FIG. 2 is an enlarged cross section view of the object lens 25. The object lens 25 is an electromagnetic lens (magnetic field lens), for example. Hereinafter, the object lens 25 of the electron microscope 2 will be referred to as electromagnetic object lens 25 to differentiate the same from an object lens of the light microscope 4 described later. The electromagnetic object lens 25 has a coil 24 and a yoke 23 covering the coil 24. The coil 24 has a cylindrical shape (ring shape), and the electromagnetic object lens 25 is also entirely shaped in a cylinder.

The electromagnetic object lens 25 has an opening at one end of the cylinder directed toward the electron gun 21 and a central axis line of the cylinder made parallel to the electron-optical axis C of the electron ray. Therefore, the internal space of the cylinder constitutes an electron-optical path 29 of the electron ray. The electron ray is entered from one end (upper end) of the cylinder to the interior of the electromagnetic object lens 25, and is released downward from the other end (lower end) of the cylinder.

The yoke 23 has a notch 26. Although there is no particular limitation on shape and position of the notch 26, the notch 26 may be formed at the internal side, upper end, or lower end of the cylinder (electromagnetic object lens 25). In each of the cases, the notch 26 is preferably shaped in a ring surrounding the electron ray.

Figure 3:
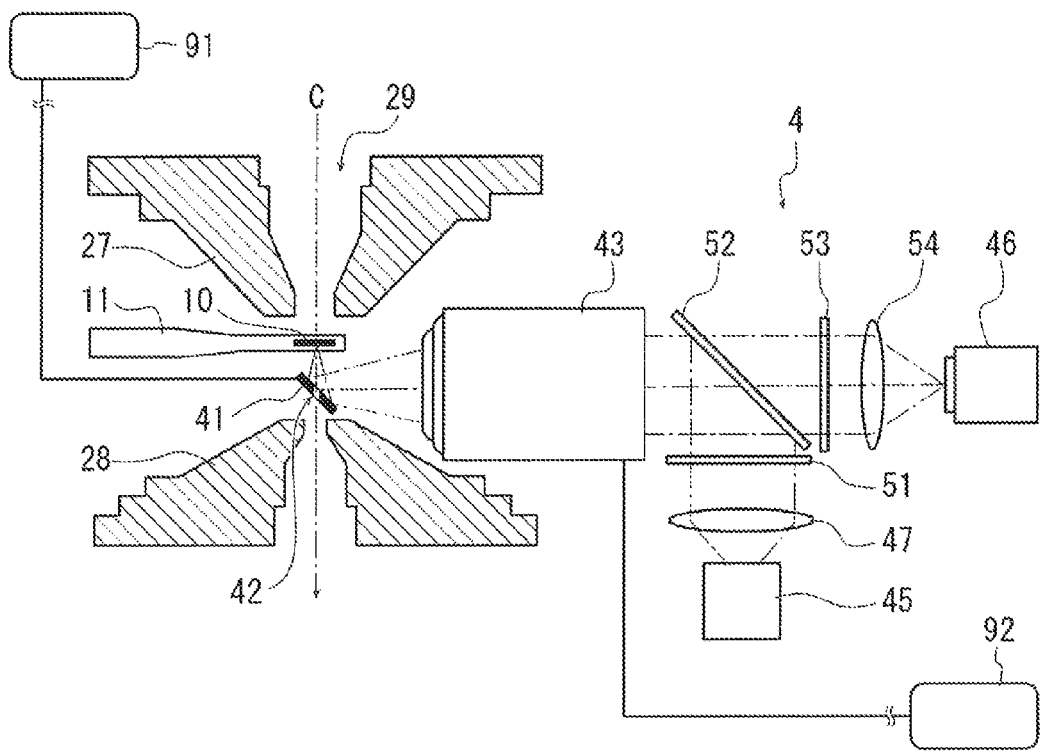
FIG. 3 is a schematic cross section view of one example of a combination of an electron magnetic object lens and a light object lens microscope.

FIG. 3 is an enlarged cross section view of a portion shown by reference sign A in FIG. 2. The portion of the yoke 23 with the notch 26 is protrudes more toward the inner side of the cylinder than the coil 24, and has a narrowed diameter for the electron-optical path 29. In the protruded portion (pole piece) of the yoke 23, a differentiation is made between an upper pole 27 closer to the electron gun 21 and a lower pole 28 farther from the electron gun 21.

In the yoke 23, at least the portion constituting the upper pole 27 and the lower pole 28 is made of a high magnetic permeability material such as iron cobalt (FeCo). The energized coil 24 forms a magnetic line that leaks from the upper pole 27 and the lower pole 28 into the electron-optical path 29, whereby the electron ray is rotated and inflected by the action of a leakage magnetic field. The leakage magnetic field can be controlled to change a position of imaging of the electron ray, by adjusting the shape and/or size of the pole piece, the amount of energization of the coil 24, and the like.

Since the portion of the notch 26 is protruded inward, there is formed a gap in the pole piece of the electromagnetic object lens 25. A specimen holder 11 is disposed in the gap. The specimen holder 11 has a portion where a specimen 10 is placed across the electron-optical path 29. The electron ray transferring through the electron-optical path 29 penetrates the specimen 10 and travels toward the detection part 30.

When a distance between the electromagnetic object lens 25 and the specimen 10 (operating distance) becomes longer, a focal distance also becomes longer to thereby increase aberration. However, it is possible to reduce aberration and increase the resolution power by placing the specimen 10 on the inner side of the electromagnetic object lens 25 (electron-optical path 29) as shown in FIG. 3.

A reflection mirror 41 is disposed on the electron-optical path 29. The reflection mirror 41 has a penetrating hole (mounting center hole) 42. The mounting center hole 42 is positioned on the electron-optical axis C and has a diameter of 0.1 to 1 mm, which is larger than a beam diameter of the electron ray. Therefore, the electron ray is not reflected by the reflection mirror 41 but passes through the mounting center hole 42. The reflection mirror 41 may be disposed either on the side nearer the detection part 30 or the electron gun 21 than the specimen 10. The electron ray, before or after penetration through the specimen 10, passes through the mounting center hole 42.

The reflection mirror 41 is positioned between the upper pole 27 and the lower pole 28. Besides the specimen holder 11, some or all parts of the light microscope 4 are disposed in the gap of the electromagnetic object lens 25. The light microscope 4 has an object lens 43, a light source 45, and a light detection part 46. At least the object lens 43 is disposed in the gap of the electromagnetic object lens 25 so as to face the reflection mirror 41. Hereinafter, the object lens 43 of the optical microscope 4 will be referred to as the light object lens to differentiate the same from the electromagnetic object lens 25.

The light source 45 is a mercury lamp, for example. Light emitted from the light source 45 is made parallel to the electron-optical axis C by an irradiation lens 47. In the direction of movement of the parallel light path is disposed a spectroscopic means. The spectroscopic means has a dichroic mirror 52, for example. The dichroic mirror 52 has a reflection surface inclined toward the optical object lens 43 and the light source 45 at a predetermined angle from a direction parallel to the electron-optical axis C (45° in this embodiment).

Of the parallel light, the light with a predetermined wavelength (excitation light) is bent in the direction of movement toward the optical object lens 43, and thus moves in a direction crossing the electron optical axis C (orthogonal direction in this embodiment), whereas the light with wavelengths other than that of the excitation light moves straight. Therefore, the excitation light enters into the optical object lens 43. It is more desired to dispose an excitation filter 51 between the dichroic mirror 52 and the irradiation lens 47 to extract the excitation light in advance.

The dichroic mirror 52, the optical object lens 43, and the reflection mirror 41 are aligned between the upper pole 27 and the lower pole 28 in a straight line perpendicular to the electron-optical axis C, that is, on a path of the excitation light. The reflection surface of the reflection mirror 41 is inclined at a predetermined angle (45° in this embodiment) from the electron optical-axis C toward the specimen 10 and the light object lens 43. After having passed through the light object lens 43, the excitation light is reflected by the reflection mirror 41 and entered into the specimen 10.

The specimen 10 is stained with a fluorescent substance and emits light upon entrance of the excitation light. The fluorescent light is reflected by the reflection mirror 41 and entered into the light object lens 43. The light detection part 46 is disposed on the opposite side of the reflection mirror 41 with the light object lens 43 there between. The dichroic mirror 52 resides between the light object lens 43 and the optical detection part 46. The fluorescent light is different in wavelength from the excitation light, and thus passes through the dichroic mirror 52 without being reflected.

An absorption filter 53 and an imaging lens 54 may be disposed between the light detection part 46 and the dichroic mirror 52. In this case, the fluorescent light is cleared by the absorption filter 53 of the excitation light and scattered light, imaged at the imaging lens 54, and then entered into the light detection part 46. The light detection part 46 is a CCD camera or the like, for example. The light detection part 46 is connected to a processing device in a computer or the like to perform an arithmetical process on the fluorescent light captured at the light detection part 46, and output results of the process to an output device (image display, printing, or the like). As in the foregoing, the light microscope 4 shown in FIG. 3 is a so-called incident-light fluorescence microscope that is capable of separating the excitation light and the fluorescent light by the dichroic mirror 52, and observing and/or shooting the specimen 10.

The electron ray to pass through the electromagnetic object lens 25 has a small beam diameter, and thus can pass through the mounting center hole 42 even if the diameter of the mounting center hole 42 is made as small as about 0.1 to 1.0 mm such that sufficient amounts of excitation light and fluorescent light can be reflected by the reflection mirror 41. Therefore, the compound microscope device 1 allows electron ray irradiation and light irradiation to the specimen 10 in a coaxial manner. This allows observation and shooting of the specimen 10 simultaneously by the transmission electron microscope 2 and the optical microscope 4.

Figure 4:
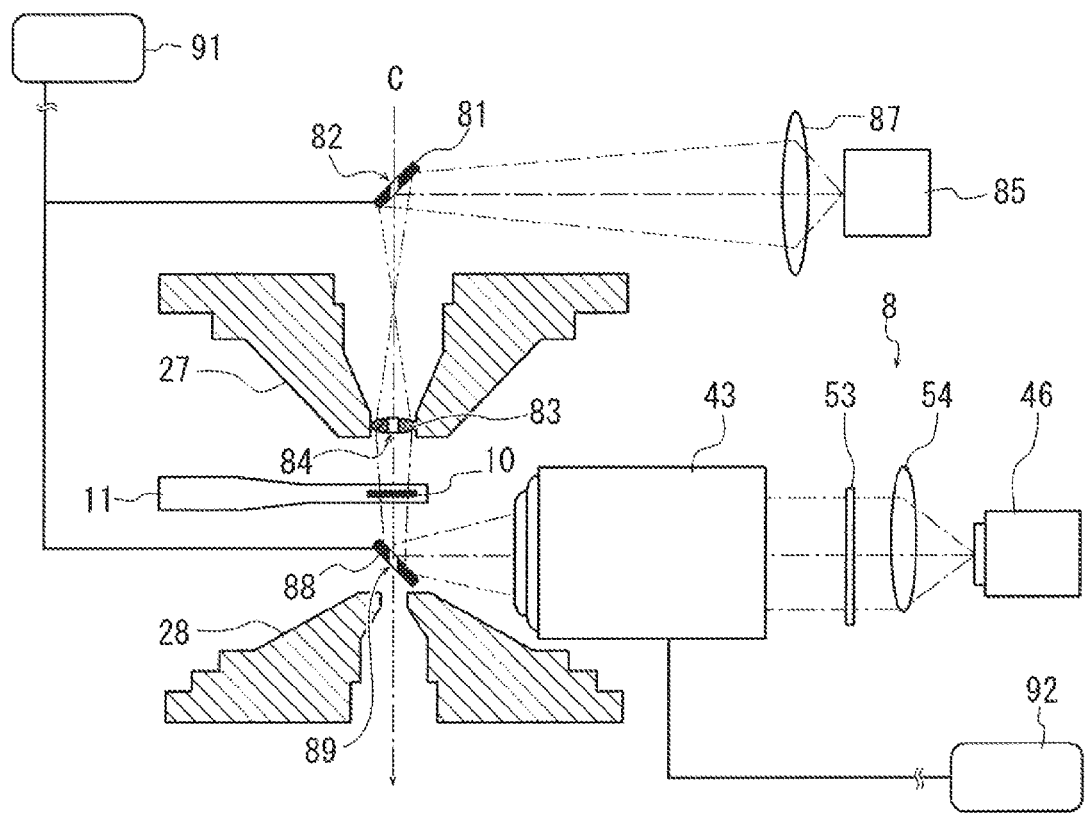
FIG. 4 is a schematic cross section view of another example a combination of an electron magnetic object lens and a light object lens microscope.

The light microscope 4 for use in the present invention is not limited to a fluorescence microscope. Another example of an optical microscope will be described below. In FIG. 4, reference code 8 denotes a bright-field light microscope. This microscope will be described with the same reference signs as those shown in FIG. 3 given to the same members as those shown in FIG. 3. In the light microscope 8, the optical detection part 46 and the light object lens 43 may be structured and arranged in the same manner as those in the light microscope 4 shown in FIG. 3, except for location of a light source 85.

The light source 85 is disposed above the upper pole 27, for example. The light source 85 is directed toward the electron optical axis C. An illumination reflection mirror 81 is disposed on the electron optical axis C in a position opposed to the light source 85. The specimen 10 can be disposed on the electron-optical path 29 inside the electromagnetic object lens 25 as in the case of FIG. 3. The illumination reflection mirror 81 has a reflection surface inclined at a predetermined angle (45° in this embodiment) from the electron-optical axis C toward the specimen 10 and the light source 85.

An irradiation lens 87 is disposed between the light source 85 and the illumination reflection mirror 81, and light from the light source 85 is collected by the irradiation lens 87 onto the reflection surface of the illumination reflection mirror 81 and reflected by the reflection surface toward the specimen 10.

The illumination reflection mirror 81 is separated from the upper pole 27 and thus there is a long distance from the illumination reflection mirror 81 to the specimen 10. In this case, a light condenser lens (light-collecting lens) 83 is interposed between the illumination reflection mirror 81 and the specimen 10. In this embodiment, the light condenser lens 83 is attached to the upper pole 27, and thus light is collected by the light condenser lens 83 and then entered into the specimen 10.

A light reflection mirror 88 is disposed on the opposite side of the illumination reflection mirror 81 with the specimen 10 therebetween. The lighting reflection mirror 88 has a reflection surface inclined at a predetermined angle (45° in this embodiment) from the electron-optical axis C toward the specimen 10 and the optical object lens 43, as with the reflection mirror 41 shown in FIG. 3. Therefore, light having been transmitted through the specimen 10 is reflected by the lighting reflection mirror 88 and entered into the light object lens 43. Beyond in a direction of the transmitted light, the light detection part 46 is disposed as in the first example (FIG. 3). Therefore, the transmitted light is entered into the light detection part 46 directly or after passing through the absorption filter 53 and the imaging lens 54.

The illumination reflection mirror 81, the light condenser lens 83, and the light reflection mirror 88 are aligned on the electron-optical axis C of the electron ray, and have respective penetrating holes (mounting center holes) 82, 84, and 89 at positions thereof falling on the electron-optical path. As with the reflection mirror 41 shown in FIG. 3, the mounting center holes 82, 84, and 89 each have a diameter set so as not to prevent passage of the electron ray (0.1 to 1 mm). Therefore, the light microscope 8 of FIG. 4 allows observation and shooting of the specimen 10, simultaneously by the transmission electron microscope 2 and the light microscope 8.

The light source 85 and the illumination reflection mirror 81 may be disposed under the lower pole 28 (that is, the detection part 30 side). In this case, the light reflection mirror 88 is disposed nearer the upper pole 27 than the specimen 10 to let in light having transmitted through the specimen 10 from underneath.

In the device of FIG. 4, spectroscopic means (a dichroic mirror, an excitation filter, or the like) is disposed between the light source 85 and the illumination reflection mirror 81 to extract the excitation light, whereby the spectroscopic means can be used as a fluorescence microscope. In this case, the fluorescence microscope detects fluorescent light released from the specimen 10 toward the lighting reflection mirror 88.

There is no particular limitation on the light object lens 43 for use in the present invention, and the light object lens 43 can use a lens equivalent to a commercially available object lens with a long working distance. It is desired to use the optical object lens 43 having a working distance at which the reflection mirrors 41 and 88 can be disposed between the specimen 10 and the optical object lens 43.

Since the light object lens 43 is placed in a ferromagnetic field and a vacuum, the light object lens 43 needs to be non-magnetic and have vacuum-resistance performance. Specifically, it is desired to change a material for a lens case body for holding the light object lens 43 from brass to non-magnetic material (for example, phosphor bronze), and form a small hole in the lens case body so as to allow communication between the space in the glass lens and a surrounding vacuum part.

In addition, although there is no particular limitation on the convergence lens 22 and the projection lens 31 of the electron microscope 2, a magnetic lens having a structure similar to that of the electromagnetic object lens 25 may be used, for example. It is desired to apply a conductive coating to surfaces of the reflection mirrors 41, 81, and 88 and/or inner wall surfaces of the mounting center holes 42, 82, and 89, a surface of the light condenser lens 83 and/or an inner wall surface of the mounting center hole 84, and a surface of the light object lens 43, for prevention of electrostatic charge by the electron ray. As a material for the conductive coating, a material with a high light transmittance, for example, one or more kinds of transparent conductive materials selected from the group consisting of indium tin oxide (ITO), zinc oxide (IZO), and indium-gallium-zinc oxide (IGZO) maybe used.

The compound microscope device 1 of the present invention emits light for light observation into the electron-optical path of the electron ray. Therefore, it is desired to apply an anti-reflection treatment (anti-reflection film) to surfaces of members of the electron microscope 2 in positions to which light (excitation light, fluorescent light, reflected light, and the like) is emitted, that is, surfaces of members around the specimen 10.

The anti-reflection treatment is a blackening treatment, for example. It is effective from a viewpoint of anti-reflection to apply the blackening treatment to the specimen holder 10, the pole piece portion of the electromagnetic object lens 25, a cooling fan for prevention of specimen contamination in the electron microscope 2, a leading end of a diaphragm unit of the electron microscope 2 (in particular, for the electromagnetic object lens 25), a portion for setting a diaphragm of the electromagnetic object lens 25, a wall surface of the vacuum bath 20 around the electromagnetic object lens 25, and the like, for example. There is no particular limitation on material for use in the blackening treatment as far as the material is a low-reflection, non-magnetic material, and thus various kinds of materials such as titanium black can be used.

It is desired to connect the reflection mirrors 41, 81, and 88 to an angle adjustment mechanism 91 such that inclination angles of the reflection mirrors 41, 81, and 88 can be changed by operations from outside of the vacuum bath 20. In this case, the angles of the reflection mirrors 41, 81, and 88 can be finely adjusted in accordance with the kind and position of the specimen 10, the kind of a fluorescent substance, excitation light, and the like, thereby allowing observation and shooting of the specimen 10 in various manners.

In addition, it is desired to connect a lens adjustment mechanism 92 to the light object lens 43 such that distances from the light object lens 43 to the reflection mirrors 41 and 88 or the like can be changed by operations from outside of the vacuum bath 20. In this case, the focus of the light object lens 43 can be finely adjusted in accordance with the kind of the specimen 10 and the like, thereby allowing observation and shooting of the specimen 10 in various manners.

Next, an example of use of the compound microscope device 1 of the present invention will be described.

In the case of observing a biological specimen with a specific organ or cell fluorescently stained, for prevention of damage to the specimen 10 due to the electron ray, first no electron ray is emitted to the specimen 10 but a field of view is searched only by the optical microscopes 4 and 8. Since the specimen 10 is fluorescently stained, it is possible to search a field of view more efficiently as compared to the case of using the electron microscope 2.

In the course of search of the field of view, the electron ray is displaced from the specimen 10 by a deflection coil. When any subject to be observed at high resolution is discovered, the electron ray is returned to the specimen 10 for high-resolution observation by the electron microscope 2. The deflection coil is disposed between the convergence lens 22 and the electromagnetic object lens 25, for example. As in the foregoing, it is important to set a time for irradiating the electron ray to the specimen as short as possible for reduction of damage to the specimen 10.

Figure 5:
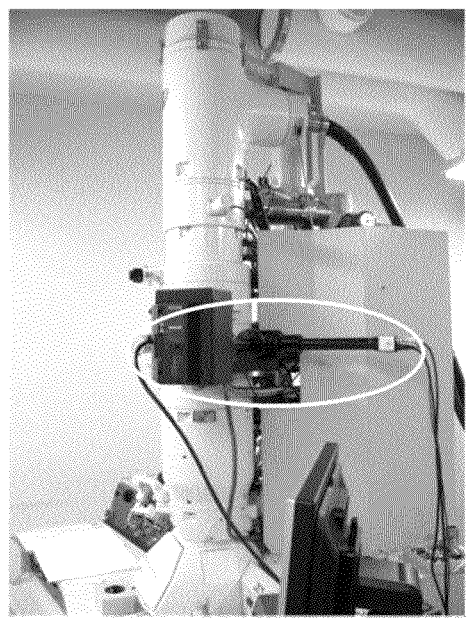
FIG. 5 is a photograph of a specific example of the compound microscope device of the present invention.
Figure 6:
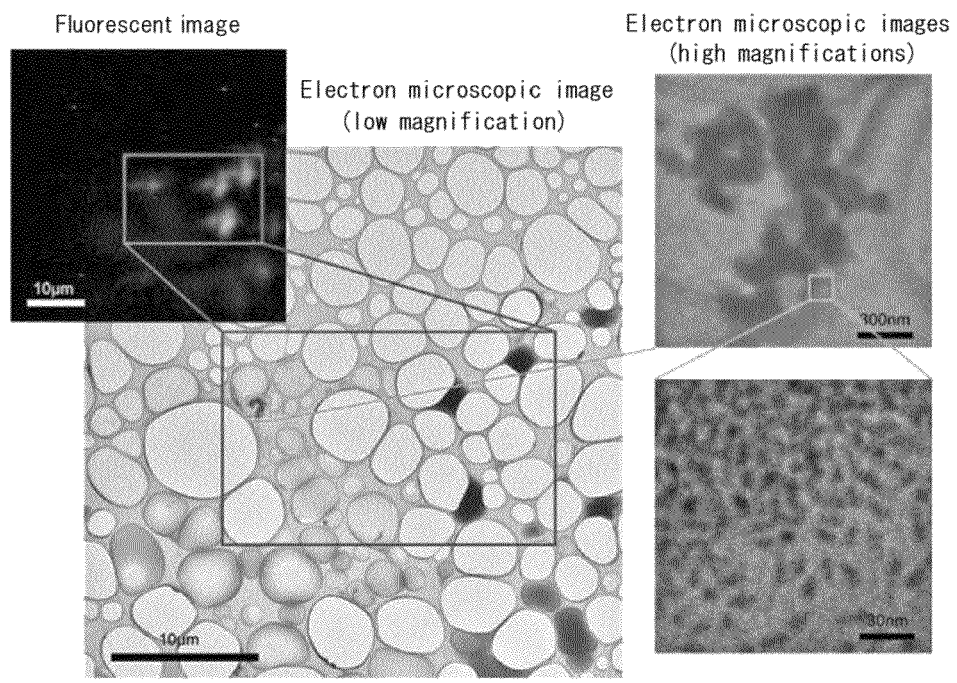
FIG. 6 represents images shot by the compound microscope device of the present invention.

FIG. 5 is a photograph of an outer appearance of one example of the compound microscope device 1 of the present invention. In an encircled portion of the photograph, the light microscopes 4 and 8 are incorporated into the electromagnetic object lens 25. FIG. 6 shows an example of simultaneous observation of inorganic Q dots as a fluorescent agent by the light microscope 4 and the electron-microscope 2 in the compound microscope device 1.

Figure 7:
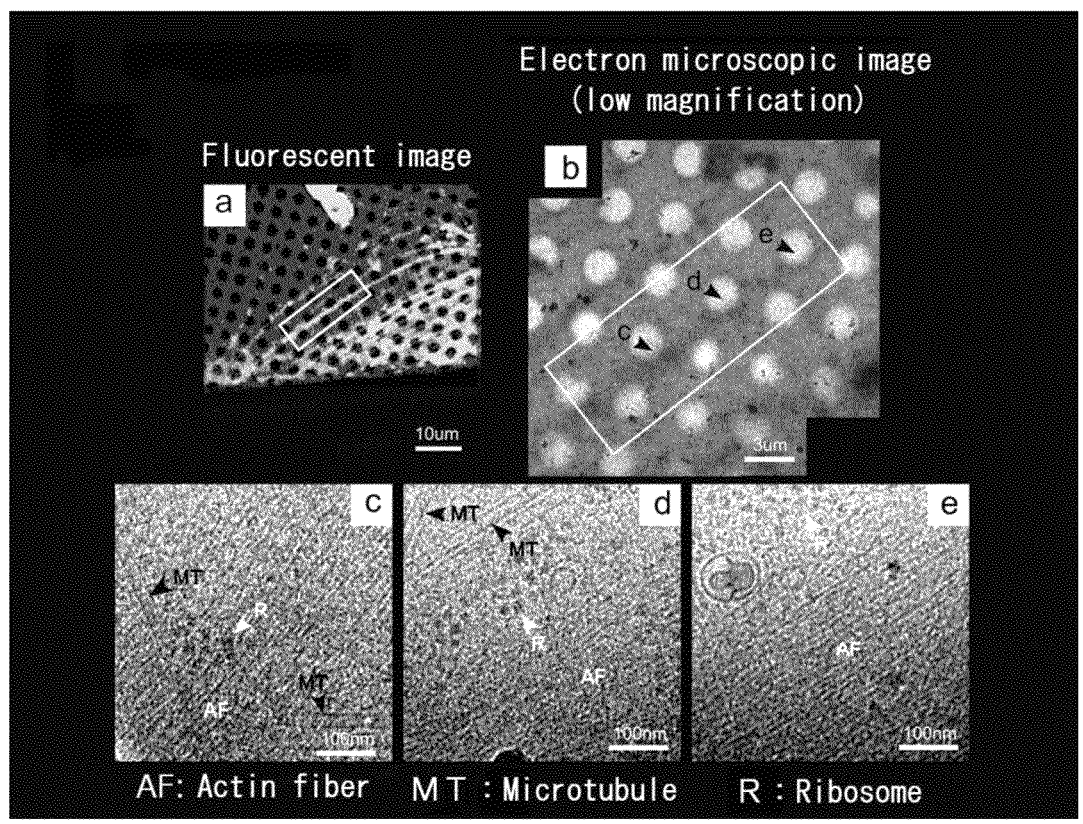
FIG. 7a is an image shot by a fluorescence microscope.
FIG. 7b is an image shot by a low-magnification electron microscope.
FIGS. 7c to 7e are images shot by a high-magnification electron microscope.
Figure 8:
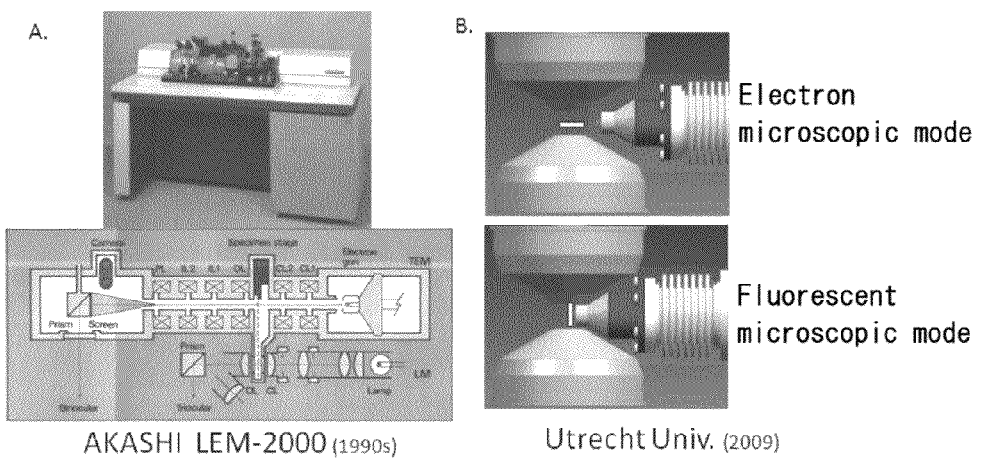
FIG. 8A is a schematic diagram of a conventional compound microscope for describing the same.
FIG. 8B is a side view of a conventional compound microscope for describing the same.

FIG. 7 shows an example of simultaneous observation of cultivated cells in which fluorescent protein-fused actin is expressed, by the light microscope 4 and the electron microscope 2 in the compound microscope device 1. It is apparent from FIGS. 6 and 7 that the electron microscope 2 is higher in resolution power than the light microscope 4. However, in the case of FIG. 6, search of a field of view for identifying the position of the Q dots can be performed more efficiently by the optical microscope 4. Therefore, the compound microscope device 1 of the present invention, having both the electron microscope 2 and the optical microscopes 4 and 8, allows high-throughput electron microscopic observation.

When a biological specimen is observed by a conventional electron microscope, the biological specimen may be damaged by the electron ray during search of a field of view. According to the compound microscope device 1 of the present invention however, first, a fluorescent portion is identified by the fluorescence microscope (FIG. 7*a*), and then the portion is magnified from lower magnification (FIG. 7*b*) to higher magnifications (FIGS. 7*c* to 7*e*) by the electron microscope, which makes it possible to observe only the region where the fluorescent molecules exist at high resolutions, while avoiding damage to the specimen 10 during search of the field of view. In actuality, in the case of FIG. 7, actin fibers can be clearly seen in the existence region of fluorescent protein specified by the fluorescence microscope, together with microtubules and ribosome in high-magnification electron microscopic images.

In addition, by combination of an already actually utilized atmospheric specimen chamber for electron microscopes and phase-contrast electron microscopy, it is possible to observe a biological specimen in the living state by optical microscopy while observing the specimen at high resolution and with high contrast for specific moments by the phase-contrast electron microscopy, in the same field of view. This allows functionality and structure of the biological body to be observed and associated with each other in real time.

REFERENCE SIGNS LIST

1: Compound microscope device
2: Electron microscope
4, 8: Light microscope
10: Specimen
11: Specimen holder
20: Vacuum chamber
21: Electron gun
23: Yoke
24: Coil
25: Electromagnetic object lens
30: Detection part
41, 81, 88: Reflection mirror
42, 82, 89: Mounting center hole (penetrating hole)
43: Light object lens
45: Light source
46: Light detection part
52: Dichroic mirror
83: Light condenser lens
91: Angle adjustment mechanism
92: Lens adjustment mechanism
C: Electron-optical axis (movement path)

The invention claimed is:

1. A compound microscope device comprising:
a transmission electron microscope including an electron gun that releases an electron ray toward a specimen, an electromagnetic object lens that images the electron ray, and a detection part into which the electron ray, having passed through the electromagnetic object lens, enters;
a fluorescent microscope including a light source that emits excitation light to irradiate the specimen, a light object lens that collects fluorescent light emitted from the specimen, and a light detection part into which the fluorescent light is entered; and
a reflection mirror arrangement that comprises one reflection mirror including a mounting center hole larger in diameter than a beam diameter of the electron ray, wherein
the electromagnetic object lens is formed by a cylindrical coil and a yoke covering the coil,
the yoke has a notch constituting a pole piece,
the one reflection mirror of the reflection mirror arrangement is disposed on an electron-optical path between upper and lower poles of the pole piece,
the electron ray passes through the mounting center hole of the one reflection mirror,
the excitation light is reflected by the reflection mirror arrangement toward the specimen,
the fluorescent light is reflected by the one reflection mirror toward the light object lens,
electron ray irradiation and excitation light irradiation are coaxially performed on the specimen, and
simultaneous observation is made by the electron microscope and the fluorescent microscope.

2. The compound microscope device according to claim 1, wherein the mounting center hole of the reflection mirror has a diameter of 0.1 to 1 mm.

3. The compound microscope device according to claim 1, comprising an angle adjustment mechanism for adjusting an inclination angle of the reflection mirror.

4. The compound microscope device according to claim 1, comprising a lens adjustment mechanism for adjusting the light object lens.

5. The compound microscope device according to claim 1, wherein an end of the notch of the yoke constituting the pole piece is protruded toward the electron optical path.

6. The compound microscope device according to claim 1, wherein the light object lens is disposed in a position separated from the electron-optical path in the electromagnetic object lens.

7. The compound microscope device according to claim 1, wherein
the fluorescence microscope is provided with a dichroic mirror that reflects excitation light emitted from the light source toward the light object lens and transmits fluorescent light having passed through the light object lens toward the light detection part,
the dichroic mirror, the light object lens, and the light detection part are arranged in a straight line crossing the electron-optical path, and
the excitation light is emitted to the specimen via the light object lens and the reflection mirror.

8. The compound microscope device according to claim 1, wherein the reflection mirror comprises a fluorescent reflection mirror that reflects the fluorescent light toward the light object lens and an illumination reflection mirror that reflects the excitation light toward the specimen, and
both the fluorescent reflection mirror and the illumination reflection mirror are provided with the mounting center hole;
the fluorescent reflection mirror is disposed on the electron-optical path between the upper and lower poles of the pole piece, and the illumination reflection mirror is disposed on the electron-optical path on an opposite side of the fluorescent reflection mirror, with the specimen therebetween.

9. The compound microscope device according to claim 8, wherein a light condenser lens is disposed on the electro-optical path between the illumination reflection mirror and the specimen, the light condenser lens having a mounting center hole through which the electron ray can pass in a position crossing the electron-optical path.

10. The compound microscope device according to claim 1, wherein the specimen is disposed nearer the upper pole of the pole piece than the reflection mirror, and the electron ray and the excitation light are emitted to the specimen in opposite directions.

* * * * *